(12) United States Patent  
Kim et al.

(10) Patent No.: US 8,464,127 B2  
(45) Date of Patent: Jun. 11, 2013

(54) METHOD AND APPARATUS FOR TRANSMITTING AND RECEIVING DATA IN RESOURCE ALLOCATION IN WIRELESS COMMUNICATION SYSTEM

(75) Inventors: Se-Ho Kim, Seoul (KR); Hee-Won Kang, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 360 days.

(21) Appl. No.: 12/972,984

(22) Filed: Dec. 20, 2010

(65) Prior Publication Data

US 2011/0161778 A1  Jun. 30, 2011

(30) Foreign Application Priority Data

Dec. 24, 2009  (KR) .................. 10-2009-0131180

(51) Int. Cl.  
*G06F 11/00* (2006.01)

(52) U.S. Cl.  
USPC ........................................ 714/758; 714/748

(58) Field of Classification Search  
USPC ............... 714/748, 749, 751, 758; 370/329, 370/332  
See application file for complete search history.

(56) References Cited

U.S. PATENT DOCUMENTS

| 8,305,944 B2 * | 11/2012 | Chun et al. ..................... 370/310 |
| 8,331,218 B2 * | 12/2012 | Ihm et al. ....................... 370/208 |
| 8,332,712 B2 * | 12/2012 | Lim et al. ....................... 714/749 |
| 2004/0141460 A1 * | 7/2004 | Holtzman et al. .............. 370/216 |
| 2007/0245202 A1 * | 10/2007 | Kim et al. ...................... 714/748 |
| 2009/0252145 A1 * | 10/2009 | Meylan et al. ................. 370/348 |
| 2010/0273435 A1 * | 10/2010 | Sun et al. ................... 455/67.13 |
| 2011/0083066 A1 * | 4/2011 | Chung et al. ................... 714/807 |
| 2012/0287889 A1 * | 11/2012 | Kim et al. ...................... 370/329 |

* cited by examiner

*Primary Examiner* — Marc Duncan  
(74) *Attorney, Agent, or Firm* — Jefferson IP Law, LLP

(57) ABSTRACT

A method and an apparatus for transmitting and receiving data in resource reallocation in a wireless communication system are provided. The method includes transmitting control information for the uplink resource reallocation to a corresponding terminal, according to the uplink resource reallocation, receiving an uplink packet from the corresponding terminal and determining whether the corresponding terminal receives the control information, and when the corresponding terminal does not receive the control information, informing the corresponding terminal of the determination result by transmitting a NULL signal over a feedback channel for previous uplink resource allocation. Thus, the resource utilization of the system can be raised by preventing repeated data retransmission until a next resource reallocation period.

32 Claims, 6 Drawing Sheets

METHOD AND APPARATUS FOR TRANSMITTING AND RECEIVING DATA IN RESOURCE ALLOCATION IN WIRELESS COMMUNICATION SYSTEM

PRIORITY

This application claims the benefit under 35 U.S.C. §119 (a) of a Korean patent application filed in the Korean Intellectual Property Office on Dec. 24, 2009, and assigned Serial No. 10-2009-0131180, the entire disclosure of which is hereby incorporated by reference.

BACKGROUND OF THE INVENTION

1. Field of the Invention:

The present invention relates generally to a method and an apparatus for transmitting and receiving data in a wireless communication system. More particularly, the present invention relates to a method and an apparatus for reducing data retransmission repeated by a MAP message reception failure when resources are reallocated in a wireless communication system based on a superframe.

2. Description of the Related Art:

A $4^{th}$ generation (4G) communication system, which is a next-generation communication system, provides users with services of various Quality of Service (QoS) levels at a data rate of about 100 Mbps. Representative examples include an Institute of Electrical and Electronics Engineers (IEEE) 802.16 standard system. The IEEE 802.16 standard system adopts Orthogonal Frequency Division Multiplexing (OFDM)/Orthogonal Frequency Division Multiple Access (OFDMA) scheme to support a broadband transmission network in physical channels.

In a broadband wireless communication system such as IEEE 802.16 standard system, a base station allocates resources to terminals to transmit and receive packets. The base station transmits to the terminal, a resource allocation MAP) message indicating resource allocation results such as a location, a size, a modulation scheme, and a code rate of the allocated resource over a downlink channel. In general, a message indicating the resource allocation results for uplink communication and a message indicating the resource allocation results for downlink communication are separately generated. The information unit for one resource allocation is referred to as a resource allocation Information Element (IE).

The resource allocation targets at the resources within a certain region. Since the resource for general data packets is allocated per regular region, the relevant resource allocation IE is transmitted per regular region. However, in a Voice over Internet Protocol (VoIP) service delivering packets on a periodic basis, having the MAP IE included in every packet transmission causes unnecessary resource waste. Accordingly, the packet of the periodic transmission period such as a VoIP packet applies a persistent allocation scheme which reduces the resource waste caused by the resource allocation IE by persistently allocating the resources. According to the persistent allocation scheme, the downlink communication transmits the resource allocation IE and the packet only in an initial resource allocation, and then only the packets are transmitted without the resource allocation IE. Hence, the terminal using the persistently allocated resource continues using the persistently allocated resource without the resource allocation IE until deallocation information or allocation change information is received. When the existing allocation information is modified, the persistent allocation scheme should transmit the resource allocation IE for a new persistent allocation. The persistently allocated resources are deallocated when the deallocation information of the VoIP packet is received.

When the persistent resource allocation in the IEEE 802.16m standard uplink is to be modified, the base station transmits to the terminal the MAP for reallocating the persistently allocated resource. When the persistent resource reallocation MAP is not received, the terminal transmits the persistently allocated packet using the previous resource allocation information, and the base station transmits a Negative ACKnowledgement (NACK) for the transmitted packet. Even when the base station recognizes that the terminal fails to receive the persistent resource reallocation MAP, the persistent resource reallocation MAP is unable to be transmitted to the terminal until the next persistent resource allocation period. That is, the terminal repeats the retransmission until the next persistent allocation period and thus the resources of the terminal are wasted.

Therefore, a need exists for addressing failure of a persistent resource reallocation MAP reception of a terminal for an uplink.

SUMMARY OF THE INVENTION

An aspect of the present invention is to address at least the above-mentioned problems and/or disadvantages and to provide at least the advantages described below. Accordingly, an aspect of the present invention is to provide a method and an apparatus for transmitting and receiving data in a resource reallocation in a wireless communication system.

Another aspect of the present invention is to provide a method and an apparatus for transmitting data when MAP message transmission fails in a resource reallocation in a wireless communication system based on a superframe.

Yet another aspect of the present invention is to provide a method and an apparatus for preventing a waste of resources caused by repetitive data retransmission when a terminal fails to transmit a persistent resource reallocation MAP message for uplink in an Institute of Electrical and Electronics Engineers (IEEE) 802.16m standard system.

According to an aspect of the present invention, a method for operating a base station for transmitting and receiving data when a resource for uplink is reallocated in a wireless communication system is provided. The method includes transmitting control information for the uplink resource reallocation to a corresponding terminal, according to the uplink resource reallocation, receiving an uplink packet from the corresponding terminal and determining whether the corresponding terminal receives the control information, and when the corresponding terminal does not receive the control information, informing the corresponding terminal of the determination result by transmitting a NULL signal over a feedback channel for previous uplink resource allocation.

According to another aspect of the present invention, a method for operating a terminal for transmitting and receiving data when a resource for uplink is reallocated in a wireless communication system is provided. The method includes receiving an uplink resource allocated and transmitting a packet to a base station, receiving one of an ACKnowledgement (ACK) signal, a Negative ACKnowledgement (NACK) signal, and a NULL signal over a feedback channel for the uplink resource allocation; and when receiving the NULL signal, receiving control information relating to uplink resource reallocation in a next uplink resource allocation period.

According to yet another aspect of the present invention, a method for operating a terminal for transmitting and receiving data when a resource for uplink is reallocated in a wireless communication system is provided. The method includes determining whether a period is an uplink persistent resource allocation period, in the uplink persistent resource allocation period, receiving one of an ACK signal, a NACK signal, and a NULL signal over a feedback channel for the uplink resource allocation, and when receiving the NULL signal, receiving control information relating to uplink resource reallocation in a next uplink resource allocation period.

According to still another aspect of the present invention, an apparatus of a base station for transmitting and receiving data when a resource for uplink is reallocated in a wireless communication system is provided. The apparatus includes a transmitter for transmitting control information for the uplink resource reallocation to a corresponding terminal, and a controller for, according to the uplink resource reallocation, receiving an uplink packet from the corresponding terminal and determining whether the corresponding terminal receives the control information, and when determining that the corresponding terminal does not receive the control information, informing the corresponding terminal of the determination result by transmitting a NULL signal over a feedback channel for previous uplink resource allocation.

According to a further aspect of the present invention, an apparatus of a terminal for transmitting and receiving data when a resource for uplink is reallocated in a wireless communication system is provided. The apparatus includes a transmitter for receiving an uplink resource allocated and transmitting a packet to a base station, and a controller for receiving one of an ACK signal, a NACK signal, and a NULL signal over a feedback channel for the uplink resource allocation, and when receiving the NULL signal, receiving control information relating to uplink resource reallocation in a next uplink resource allocation period.

According to a further aspect of the present invention, an apparatus of a terminal for transmitting and receiving data when a resource for uplink is reallocated in a wireless communication system includes a controller for determining whether a period is an uplink persistent resource allocation period, in the uplink persistent resource allocation period, receiving one of an ACK signal, a NACK signal, and a NULL signal over a feedback channel for the uplink resource allocation, and when receiving the NULL signal, receiving control information relating to uplink resource reallocation in a next uplink resource allocation period.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of the present invention will become more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention provide a method and an apparatus for transmitting and receiving data in a resource reallocation in a broadband wireless communication system. More particularly, exemplary embodiments of the present invention provide a technique for providing information of MAP message reception failure to a terminal using a pre-allocated Hybrid Automatic Repeat ReQuest (HARQ) Feedback Allocation (HFA) channel when resource reallocation MAP message transmission for uplink fails in an Institute of Electrical and Electronics Engineers (IEEE) 802.16m standard system.

Hereinafter, Orthogonal Frequency Division Multiplexing (OFDM)/Orthogonal Frequency Division Multiple Access (OFDMA) wireless communication system is exemplified. The exemplary embodiments of the present invention may be equally applicable to other wireless communication systems.

Figure 1:
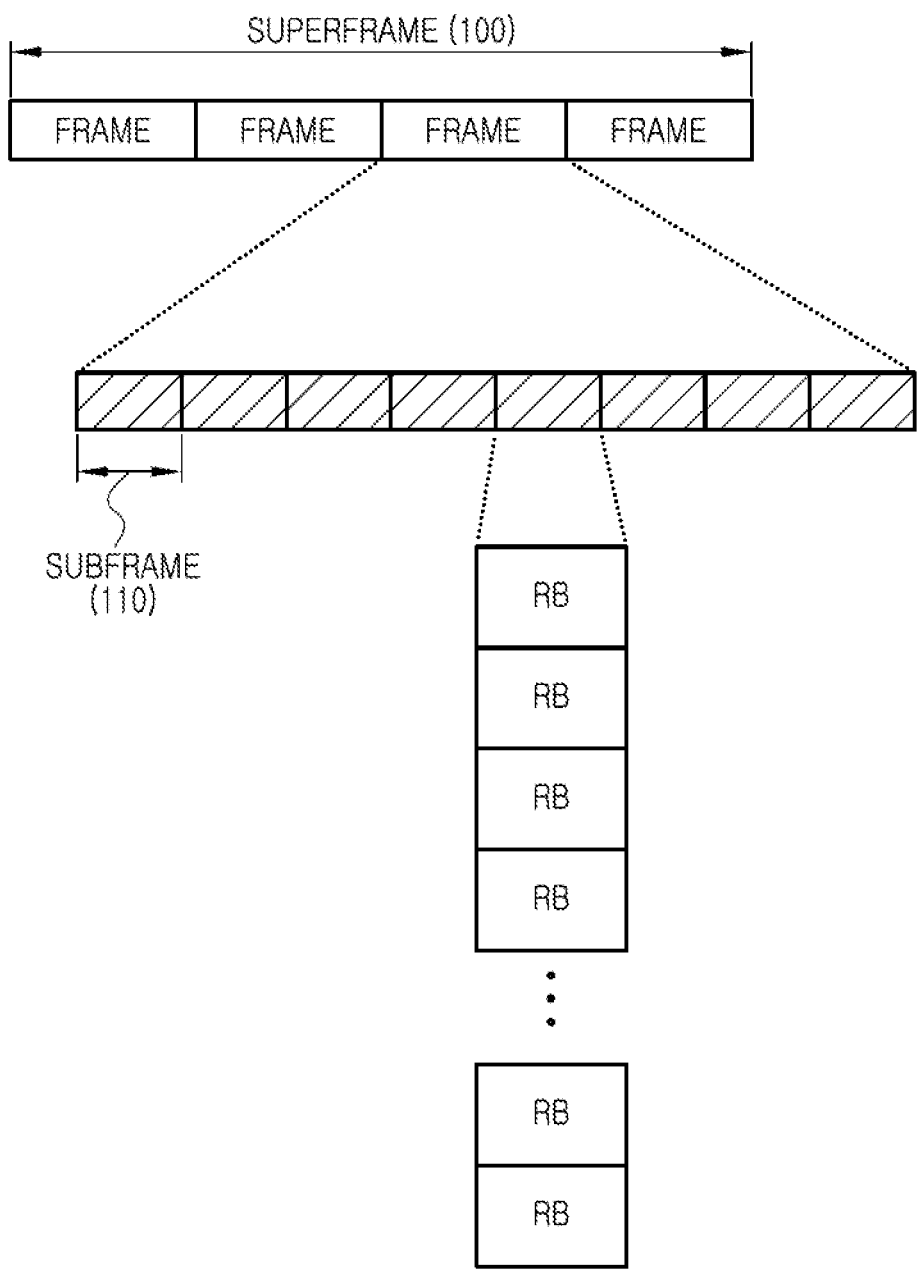
FIG. 1 is a diagram of a frame structure in a broadband wireless communication system according to an exemplary embodiment of the present invention.

FIG. 1 is a diagram of a frame structure in a broadband wireless communication system according to an exemplary embodiment of the present invention.

Referring to FIG. 1, an exemplary superframe 100 includes a plurality of frames. Herein, each frame includes a plurality of subframes 110, and a subframe includes a plurality of OFDMA symbols. Resource allocation targets at resources in each subframe. The resource in the subframe is allocated on a Resource Block (RB) basis. That is, a terminal communicating with a base station is allocated an integer number of RBs.

A MAP message is transmitted per subframe. MAP Information Elements (IEs) indicating resource allocation information contained in the MAP message each go through a Cyclic Redundancy Check (CRC) process using a specific sequence allocated to a terminal which is to receive the MAP IE. Hence, each terminal distinguishes its MAP IE by CRC-checking the MAP IEs with its allocated sequence. This process of MAP IE coding is referred to as a separate coding.

Persistent resource allocation is performed for traffic which generates packets on a periodic basis. In the persistent resource allocation, an allocation period of the persistently allocated packet is determined based on a persistent resource allocation period. The persistent resource allocation period is expressed with the number of frames. The persistently allocated packet is transmitted at a fixed location on the periodic basis according to the persistent resource allocation period. When the allocation information is not changed after comparing with allocation information of the previous packet transmission, the persistent resource packet transmission is carried out without persistent resource allocation IE.

The persistently allocated resource is transmitted by regular periods according to the persistent resource allocation period without resource allocation IE. Since the location is fixed and the repetitive resource allocation information is unnecessary, the persistent resource allocation is possible without the resource allocation IE. When it is necessary to change the persistently allocated resource, the base station transmits a persistent resource reallocation IE over the subframe of the persistently pre-allocated resource. The terminal, upon receiving the persistent resource reallocation IE, deallocates the pre-allocated persistent resource and commences the persistent resource allocation using the reallocated resource allocation information.

In uplink resource allocation according to the IEEE 802.16m standard, retransmission adopts a synchronous scheme. The synchronous retransmission scheme retransmits the packet using the same resource allocation information as an initial packet at the location of the initial packet. Since the resource allocation information of the initial packet and the retransmit packet are identical, a resource allocation IE (i.e., an UpLink (UL) basic assignment Allocation (A)-MAP IE) for the retransmission is not transmitted to the terminal. In the IEEE 802.16m standard, the retransmission of the uplink persistent resource allocation conforms to the synchronous retransmission scheme. When the base station transmits the persistent resource allocation IE (i.e., the UL persistent A-MAP IE) to the terminal, the terminal reallocates the persistent resource using the resource allocation information of the reallocation IE. When receiving a Negative ACKnowledgement (NACK) from the base station in relation to the transmitted persistent resource, the terminal performs the synchronous retransmission at the reallocated location.

Figure 2:
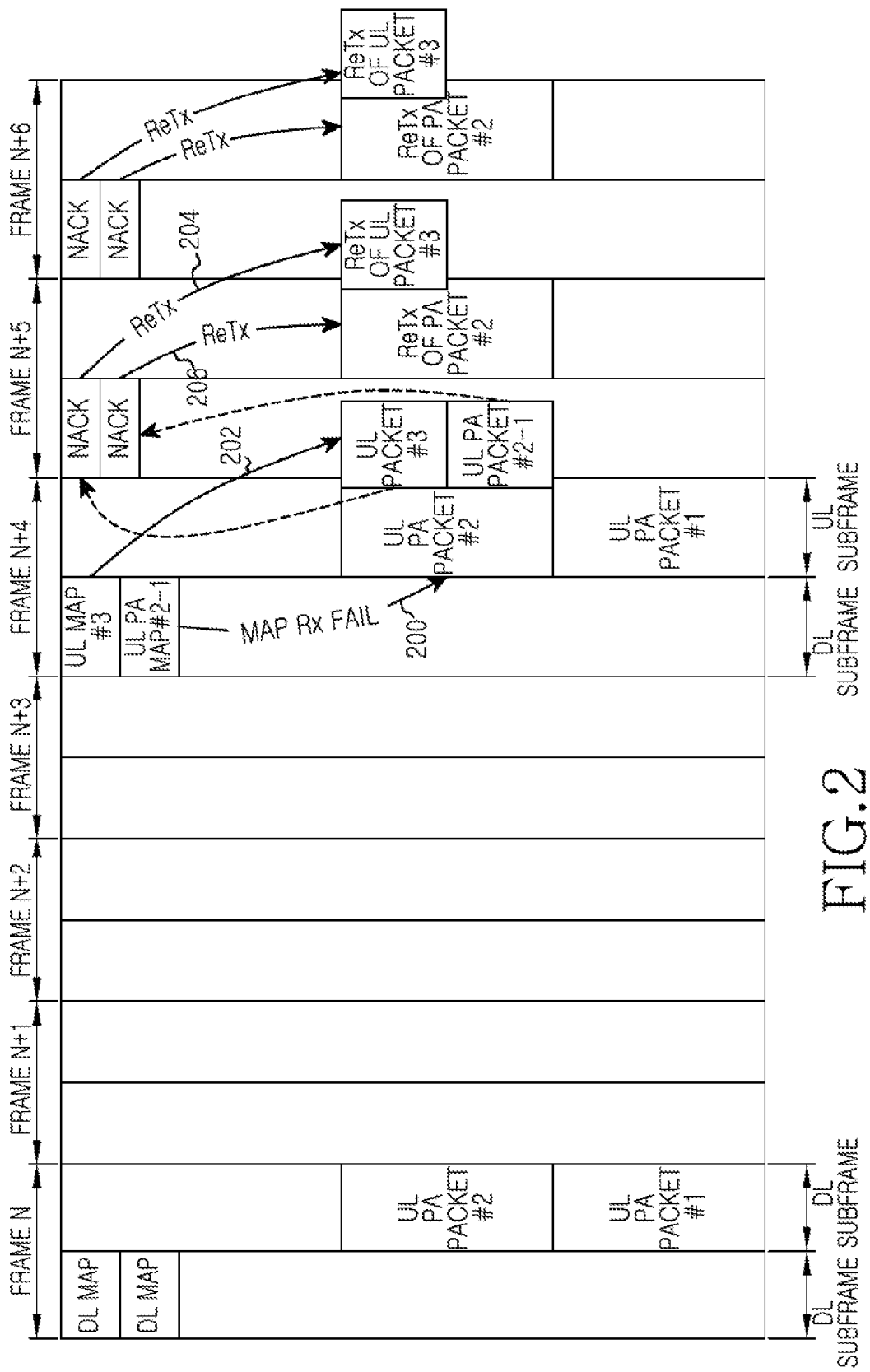
FIG. 2 is a diagram of persistent resource allocation according to a persistent resource allocation period according to an exemplary embodiment of the present invention.

FIG. 2 is a diagram of persistent resource allocation according to a persistent resource allocation period according to an exemplary embodiment of the present invention.

Herein, the persistent resource allocation period is assumed to be four frames.

Referring to FIG. 2, to transmit packets UL_PA_packet#1 and UL_PA_packet#2 persistently allocated in frame M, resource allocation locations for UL_PA_packet#1 and UL_PA_packet#2 are provided using the persistent resource allocation IE (UL MAP) contained in the UL MAP message.

To change the persistently allocated packet UL_PA_packet#2 to UL_PA_packet#2-1 in frame N+4, which is the persistent resource allocation period, the base station transmits the persistent resource reallocation IE (including UL_PA_MAP#2-1) to the terminal to thus inform of the altered resource allocation location of the packet UL PApacket#2-1. At the same time, it is assumed that UL_PA packet#3 is allocated to the location of the persistent resource allocation in the frame N+4 in step 202. When the persistent resource reallocation IE (including UL_PA_MAP#2-1) is not received in step 200, the terminal cannot transmit the UL_PA_ packet#2-1 at the altered resource allocation location but transmits the UL_PA_packet#2 at the pre-allocated persistent allocation, which collides with UL_PA_packet#3 transmitted by another terminal which is assigned the persistent resource.

The base station, which does not receive the UL_PA_packet#2, receives a packet at the location of the allocated UL_PA_packet#2-1 in frame N+5 and transmits a NACK signal to the terminal. In addition, the UL_PA_packet#3 is not received, the base station receives a packet at the location of the allocated UL_PA_packet#3 and transmits the NACK signal to the terminal.

Meanwhile, since the terminal cannot know that the persistent resource is reallocated by the base station, the terminal upon receiving the NACK signal in the frame N+5 recognizes the NACK signal for the pre-allocated persistent resource and retransmits the UL_PA_packet#2 in step 206. Since the UL_PA_packet#3 collides with the UL_PA_packet#2 and thus does not arrive at the base station, the base station transmits the NACK signal in the frame N+5 and retransmits the UL_PA_packet#3 in step 204.

However, since the base station cannot receive the UL_PA_packet#2 and the UL_PA_packet#3, which collide with each other and were transmitted from the terminal in the frame N+5, the base station transmits the NACK signal in frame N+6 and the terminal retransmits the UL_PA_packet#2 and the UL_PA_packet#3 in the frame N+6.

Although the base station recognizes that the terminal fails to receive the persistent resource reallocation IE, the base station has to wait for the next persistent resource allocation period in order to retransmit the persistent resource reallocation MAP to the terminal Even when the terminal successfully receives a new persistent resource reallocation MAP in the next persistent resource allocation period, the terminal repeats the synchronous retransmission of the packet allocated in a previous persistent resource allocation period up to a maximum number of the retransmissions defined by the system because the terminal does not know whether the new persistent resource reallocation IE is transmitted in the previous persistent resource allocation period. As a result, the resources are wasted.

To address this problem, the base station determines whether the terminal receives the persistent resource reallocation IE of an uplink, and informs the previous persistent resource allocation IE of the determination result using a feedback channel (e.g., an ACKnowledgement (ACK) channel) for the MAP. If there is no ACK channel for the resource allocation MAP, the base station predicts whether the terminal transmits the packet at the resource reallocation location, by determining a Carrier to Interference-and-Noise Ratio (CINR) of the received packet, and determines whether the terminal receives the resource reallocation MAP message.

That is, when transmitting the persistent resource allocation IE for the uplink to the terminal, the base station determines whether the terminal receives the MAP message. When the terminal fails to receive the persistent resource reallocation IE, the base station may determine information of the ACK channel of the pre-allocated persistent resource and information of the ACK channel of the reallocated persistent resource. While the base station has to transmit the ACK signal or the NACK signal to the terminal using the ACK channel assigned to the persistent resource reallocation IE, it is impossible for the terminal to receive the ACK signal or the NACK signal which is transmitted over the reallocated ACK channel. Namely, since the terminal fails to receive the persistent resource reallocation IE newly allocated, the terminal determines the ACK signal or the NACK signal using the pre-allocated ACK channel and determines whether to retransmit the packet. Accordingly, when the terminal cannot receive the persistent resource reallocation IE, the base station transmits feedback information to the terminal using the ACK channel for the previous persistent resource allocation. When the base station transmits the ACK signal over the pre-allocated ACK channel, the terminal determines its successful packet transmission for the uplink. When the base station transmits the NACK signal, the terminal determines failure of its packet transmission and retransmits the pre-allocated persistent resource. In other words, when the base station transmits the ACK signal using the ACK channel used by the pre-allocated persistent resource, a packet loss is incurred. When the base station transmits the NACK signal, the retransmission is repeated in the uplink.

In an exemplary embodiment of the present invention, the base station transmits an ACK/NACK/NULL signal using the ACK channel for the pre-allocated resource. More specifically, when the persistent resource reallocation IE for the uplink is transmitted and the terminal fails to receive the transmitted IE, the base station transmits a NULL signal to the terminal over the pre-allocated ACK channel. The terminal determines the ACK/NACK/NULL signal. Upon receiving the NULL signal, the terminal determines that the persistent resource reallocation IE is allocated to itself but the terminal fails to receive it, does not perform the synchronous retransmission, and receives a new persistent resource allocation IE in the next persistent resource allocation period. Since the persistent resource allocation IE is transmitted only in the persistent resource allocation period, the terminal determines whether to retransmit the packet by determining the ACK/NACK/NULL signal of the feedback information for the packet transmitted in the persistent resource allocation period, and determines whether to retransmit the packet by determining the ACK/NACK signal of the feedback information for the packet transmitted in the frame out of the persistent resource allocation period.

Figure 3:
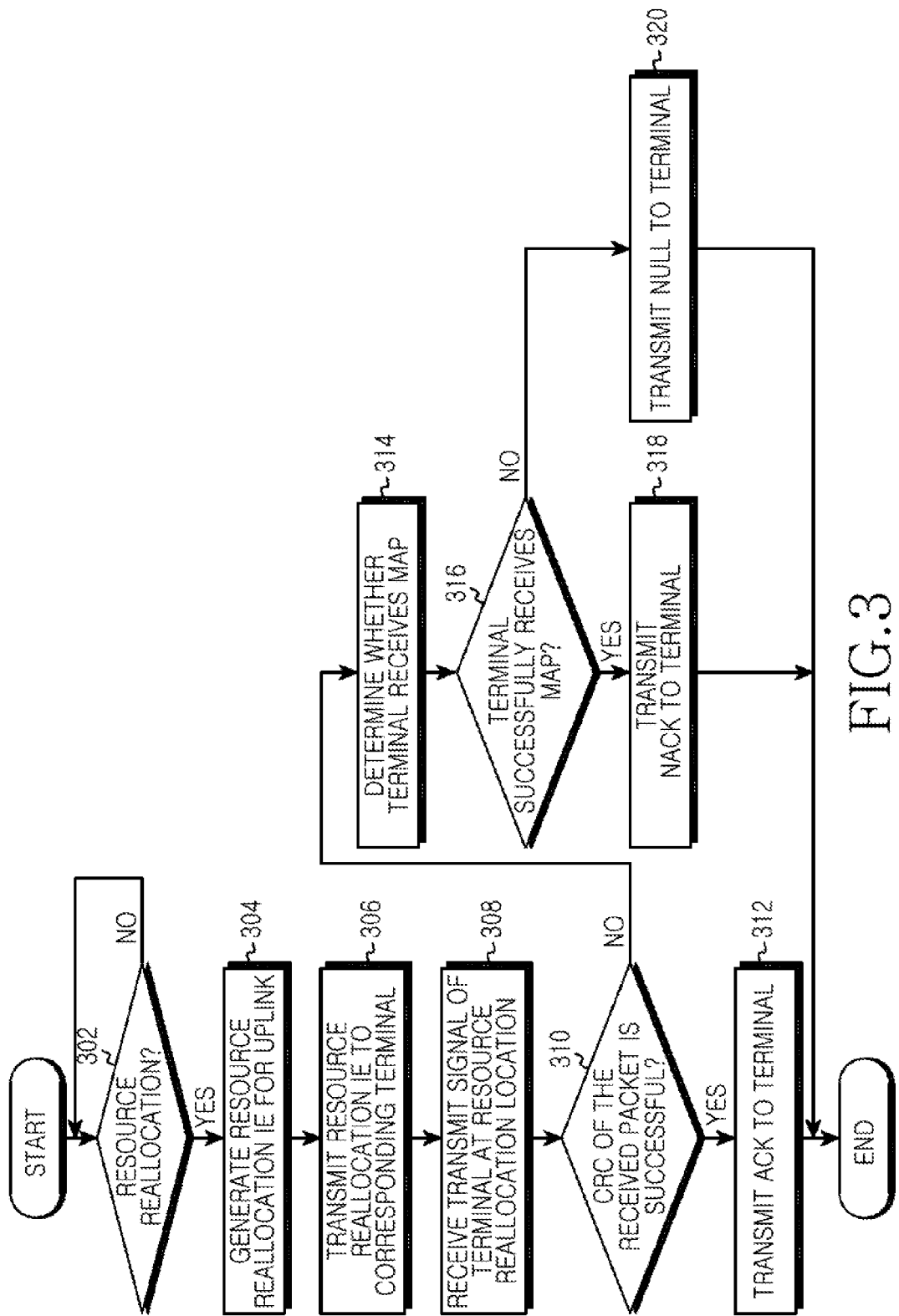
FIG. 3 is a flowchart of operations of a base station for transmitting and receiving data according to a resource reallocation Information Element (IE) for uplink in a broadband wireless communication system according to an exemplary embodiment of the present invention.

FIG. 3 is a flowchart of operations of a base station for transmitting and receiving data according to a resource reallocation IE for uplink in a broadband wireless communication system according to an exemplary embodiment of the present invention.

Referring to FIG. 3, when requiring the resource reallocation for the uplink in step 302, the base station generates a resource reallocation IE for the uplink in step 304 and transmits the resource reallocation IE for the uplink to the corresponding terminal in step 306.

In step 308, the base station receives a transmit packet of the terminal at the uplink location reallocated by the resource reallocation IE.

In step 310, the base station CRC-checks the received transmit packet of the terminal. When the CRC is successful, the base station transmits to the terminal an ACK signal informing that the transmit packet of the terminal is received at the uplink location reallocated via a downlink feedback channel (i.e., a downlink ACK channel) for the resource reallocation in step 312.

In contrast, when the CRC fails in step 310, the base station determines whether a MAP for the resource reallocation is received in step 314. Whether the MAP for the resource reallocation is received is determined based on a CINR value of the received transmit packet of the terminal.

Upon determining the successful reception of the MAP message of the terminal based on the CINR value of the received transmit packet of the terminal in step 316, the base station informs of the reception failure of the transmit packet by transmitting the NACK signal to the terminal at the uplink location reallocated via the downlink feedback channel (i.e., the downlink ACK channel) for the resource reallocation in step 318.

In contrast, when determining the reception failure of the MAP message of the terminal based on the CINR value of the received transmit packet of the terminal in step 316, the base station transmits the NULL signal over the downlink feedback channel (i.e., the downlink ACK channel) for the previous resource allocation so that the terminal does not perform the synchronous retransmission in step 320.

The base station ends the process.

Figure 4:
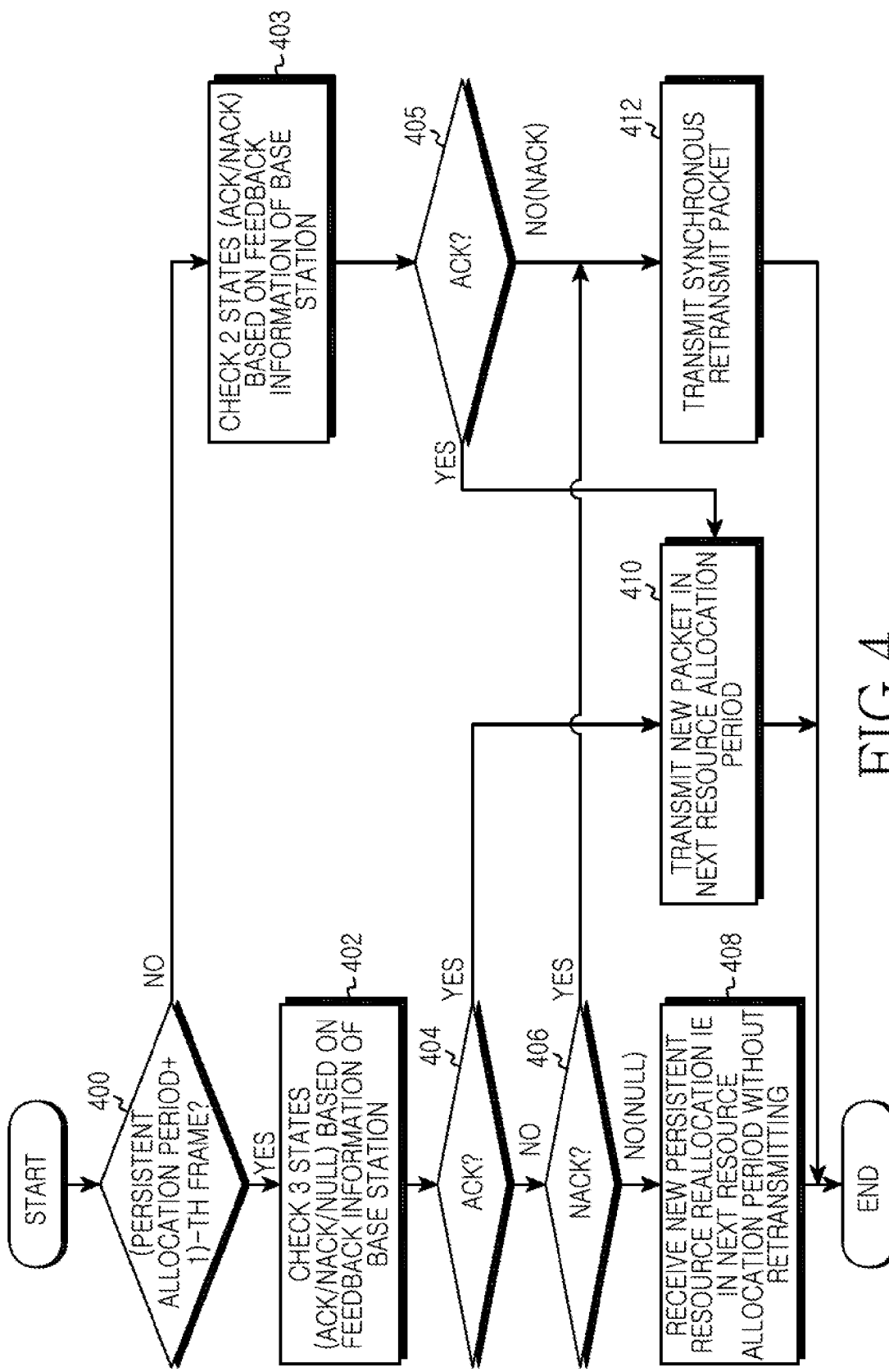
FIG. 4 is a flowchart of operations of a terminal for transmitting and receiving data based on feedback information for an uplink resource reallocation IE in a broadband wireless communication system according to an exemplary embodiment of the present invention.

FIG. 4 is a flowchart of operations of a terminal for transmitting and receiving data based on feedback information for an uplink resource reallocation IE in a broadband wireless communication system according to an exemplary embodiment of the present invention.

Referring to FIG. 4, in step 400, the terminal determines whether there is a next persistent resource allocation period (i.e., the persistent allocation period+1). If it is determined that there is a next persistent resource allocation period, the terminal determines an ACK/NACK/NULL signal by checking a downlink feedback channel (i.e., an ACK channel) of the base station in step 402.

In step 404, the terminal determines whether the ACK signal is received. If it is determined that the ACK signal is not received, the terminal determines whether the NACK signal is received in step 406. If it is determined that the NACK signal (i.e., the NULL signal) is not received in step 406, the terminal receives the new persistent resource reallocation IE in the next persistent resource allocation period (i.e., the persistent allocation period+2) without retransmission in step 408. That is, upon receiving the NULL signal, the terminal recognizes that it has failed to receive the persistent resource reallocation IE transmitted from the base station, waits for the next persistent resource allocation period without retransmitting the previous packet, and then receives the new persistent resource reallocation IE.

When receiving the NACK signal in step 406, the terminal recognizes that the base station does not receive the previous packet, and transmits the synchronous retransmit packet in step 412.

When receiving the ACK signal in step 404, the terminal recognizes that the base station receives the previous packet, and transmits a new packet in the next resource allocation period in step 410.

Meanwhile, when the next persistent resource allocation period is not received in step 400, the terminal determines whether the ACK/NACK signal is received based on the feedback information of the base station in step 403.

If it is determined that the ACK signal is received in step 405, the terminal recognizes that the base station receives the previous packet, and transmits a new packet in the next resource allocation period in step 410.

If it is determined that the ACK signal is not received (i.e., if it is determined that the NACK signal is received) in step 406, the terminal recognizes that the base station does not receive the previous packet, and transmits the synchronous retransmit packet in step 412.

As described above, in the persistent resource allocation period, the terminal analyzes the feedback information of the ACK channel as the three states of ACK/NACK/NULL signal. In a non-persistent resource allocation period, the terminal analyzes the feedback information of the ACK channel as two states of ACK/NACK signal.

In various implementations, the terminal may transmit the uplink packet by analyzing the three states of the ACK/NACK/NULL signal regardless of the persistent resource allocation period.

Figure 5:
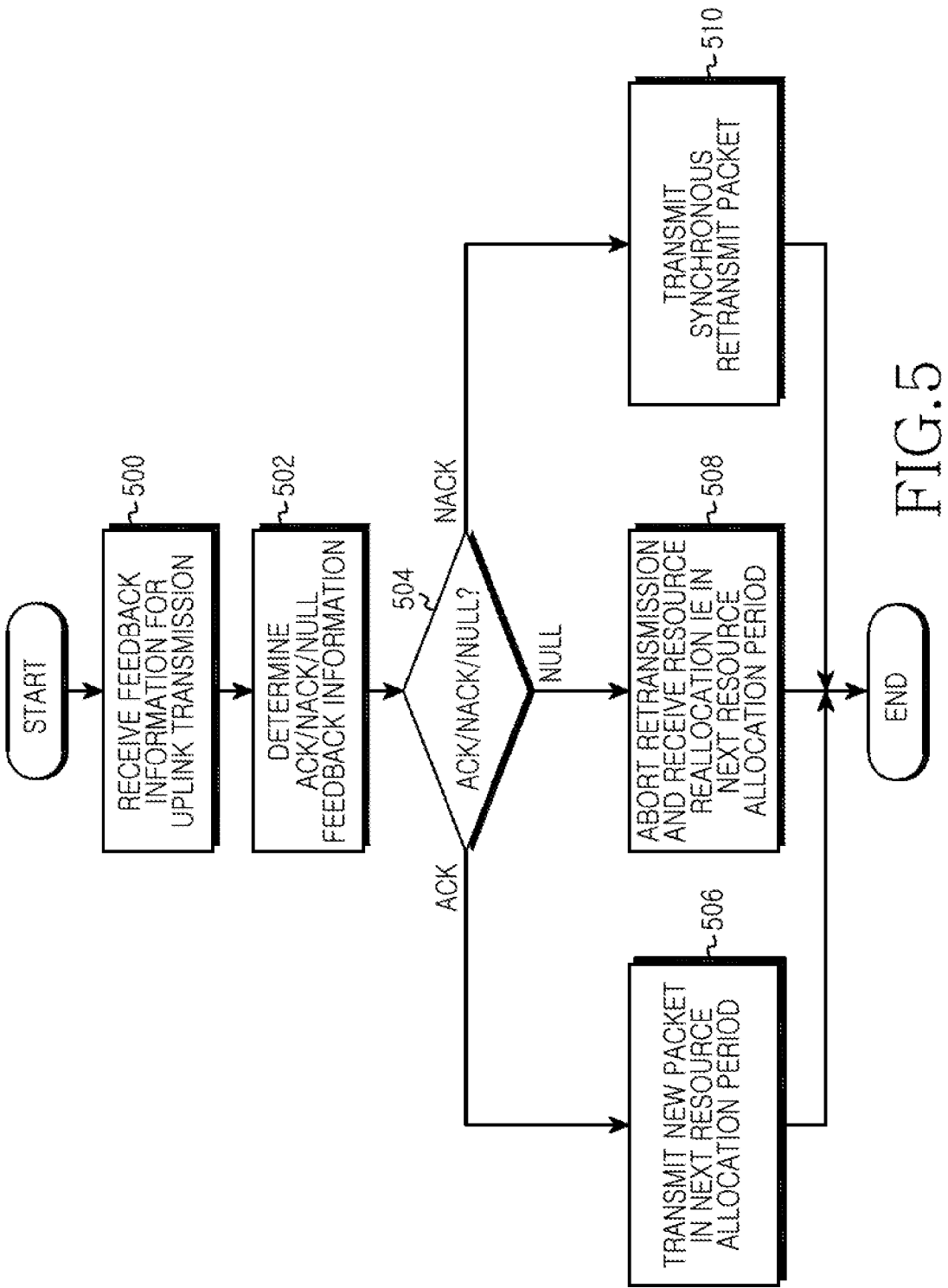
FIG. 5 is a flowchart of operations of a terminal for transmitting and receiving data based on feedback information for an uplink resource reallocation IE in a broadband wireless communication system according to an exemplary embodiment of the present invention.

FIG. 5 is a flowchart of operations of a terminal for transmitting and receiving data based on feedback information for an uplink resource reallocation IE in a broadband wireless communication system according to an exemplary embodiment of the present invention.

Referring to FIG. 5, in step 500, the terminal receives the feedback information (i.e., the ACK channel) for the uplink transmission, from the base station.

In step 502, the terminal determines whether the feedback information is an ACK/NACK/NULL signal.

If it is determined that the feedback information is the ACK signal in step 504, the terminal recognizes that the base station receives the previous packet, and transmits a new packet in the next resource allocation period in step 506.

If it is determined that the feedback information is the NULL signal in step 504, the terminal recognizes that it has failed to receive the persistent resource reallocation IE transmitted from the base station, waits for the next persistent resource allocation period without retransmitting the previous packet, and then receives the new persistent resource reallocation IE in step 508.

If it is determined that the feedback information is the NACK signal in step 504, the terminal recognizes that the base station does not receive the previous packet, and transmits the synchronous retransmit packet in step 510.

The terminal ends the process.

Figure 6:
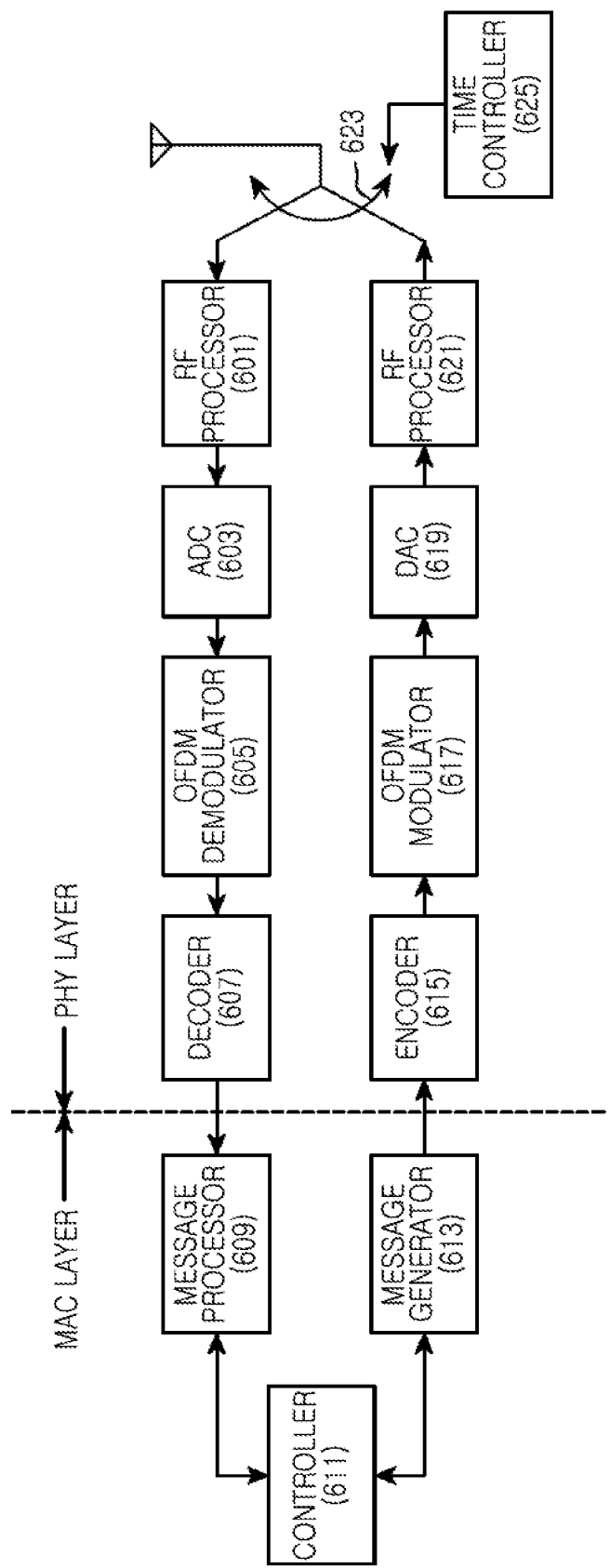
FIG. 6 is a block diagram of a base station or a terminal according to an exemplary embodiment of the present invention.

FIG. 6 is a block diagram of a base station or a terminal according to an exemplary embodiment of the present invention.

Hereinafter, a Time Division Duplex (TDD)-OFDMA system is assumed.

Referring to FIG. 6, the base station or the terminal includes a first Radio Frequency (RF) processor 601, an Analog-to-Digital Converter (ADC) 603, an OFDM demodulator 605, a decoder 607, a message processor 609, a controller 611, a message generator 613, an encoder 615, an OFDM modulator 617, a Digital-to-Analog Converter (DAC) 619, a second RF processor 621, a switch 623, and a time controller 625.

The time controller 625 controls the switching operation of the switch 623 based on time synchronization. For example, in a signal reception, the time controller 625 controls the switch 623 to interconnect an antenna and the RF processor 601 of a receiving stage. In the signal transmission, the time controller 625 controls the switch 623 to interconnect the antenna and the second RF processor 621 of the transmitting stage.

In the reception, the RF processor 601 converts an RF signal received via an antenna to a baseband analog signal. The ADC 603 converts the analog signal output from the RF processor 601 to sample data. The OFDM demodulator 605 converts the sample data output from the ADC 603 to frequency-domain data using a Fast Fourier Transform (FFT), and selects and outputs data of subcarriers to actually receive from the frequency-domain data.

The decoder 607 demodulates and decodes the data output from the OFDM demodulator 605 according to a preset modulation level (i.e., a Modulation and Coding Scheme (MCS) level).

The message processor 609 decomposes a control message fed from the decoder 607 and provides the result to the controller 611. The controller 611 correspondingly processes information output from the message processor 609, and generates and outputs information to transmit to the message generator 613. The message generator 613 generates a message with various information provided from the controller 611 and outputs the message to the encoder 615 of the physical layer.

The encoder 615 modulates and encodes the data output from the message generator 613 according to the preset modulation level (i.e., the MCS level). The OFDM modulator 617 outputs the data fed from the encoder 615 as sample data (i.e., OFDM symbols) using an Inverse FFT (IFFT). The DAC 619 converts the sample data to an analog signal. The second RF processor 621 converts the analog signal output from the DAC 619 to an RF signal and transmits the RF signal via the antenna.

As constructed above, the controller 611, which is a protocol controller, controls the message processor 609 and the message generator 613. That is, the controller 611 may function as the message processor 609 and the message generator 613. Herein, the message processor 609 and the message generator 613 are separately provided to distinguish their functions. Thus, in the implementation, the controller 611 may process all or part of the functions of the message processor 609 and the message generator 613.

The controller 611 receives information required for protocol processing from the corresponding component of the physical layer, or issues a control signal to the corresponding component of the physical layer. For example, the controller 611 may issue the control signal to control a subcarrier allocation scheme (or a subchannel allocation scheme) of the OFDM modulator 617, or receive signal intensity information (e.g., Signal-to-Noise Ratio (SINR), Received Signal Strength Indicator (RSSI), and the like) from the physical layer.

The operations of the terminal and the base station are described based on the structure of FIG. 6. The control message processing in a Media Access Control (MAC) layer is described below.

In the terminal, the message processor 611 decomposes the control signal received from the base station and provides the result to the controller 611. When the UL-MAP message for the uplink resource allocation is received, the message processor 611 extracts various control information from the received message and provides the control information to the controller 611. The message processor 611 extracts the feedback information received over a downlink ACK channel and provides the feedback information to the controller 611.

The controller 611 controls to transmit the packet based on the uplink resource allocation control information and the feedback information. More specifically, when receiving the ACK, the controller 611 recognizes that the base station receives the previously transmitted packet, and provides a new packet to the OFDM modulator 617 in a next resource allocation period. According to the control information, the OFDM modulator 617 performs the OFDM modulation by mapping the packet to corresponding subcarriers. When receiving a NULL signal, the controller 611 recognizes that the terminal fails to receive the persistent resource reallocation IE transmitted from the base station, waits for the next persistent resource allocation period without retransmitting the previous packet, and then receives the new persistent resource reallocation IE. When receiving a NACK signal, the controller 611 recognizes that the base station does not receive the previous packet, and transmits the synchronous retransmit packet.

In the base station, the message generator 613 generates and provides the message to transmit to the terminal to the physical layer under the control of the controller 611. The message generator 613 generates and outputs the feedback information (i.e., the ACK/NACK/NULL signal) for the terminal to the physical layer. The message generated at the message generator 613 is processed into a transmittable form in the physical layer and then transmitted via the antenna.

When the resource reallocation for the uplink is necessary, the controller 611 generates the control information required for the resource reallocation for the uplink and provides the control information to the message generator 613 in step 304. The message generator 613 generates the resource reallocation IE. The generated message is processed into the transmittable form in the physical layer and then transmitted via the antenna.

Meanwhile, the controller 611 receives the transmit packet of the terminal at the uplink location reallocated through the resource reallocation IE, and performs CRC. When the CRC is successful, the controller 611 generates the ACK signal informing of reception of the transmit packet of the terminal at the uplink location reallocated through the downlink feedback channel (i.e., the downlink ACK channel) for the resource reallocation. In contrast, when the CRC fails, the controller 611 determines whether the MAP for the resource reallocation is received. Whether the MAP for the resource reallocation is received, is determined based on the CINR value of the transmit packet of the terminal. Upon determining a successful reception of the MAP message of the terminal based on the CINR value of the transmit packet of the terminal, the controller 611 generates the NACK signal at the uplink location reallocated via the downlink feedback channel (i.e., the downlink ACK channel) for the resource reallocation. In contrast, when determining the reception failure of the MAP message of the terminal based on the CINR value of the transmit packet of the terminal, the controller 611 generates the NULL signal over the downlink feedback channel (i.e., the downlink ACK channel) for the previous resource allocation.

As set forth above, the information as to whether the resource reallocation MAP message for the uplink is received is provided to the terminal in the wireless communication system based on the superframe. Therefore, the resource utilization of the system can be raised by preventing the repeated data retransmission until the next resource reallocation period.

While the invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A method for operating a base station for transmitting and receiving data when a resource for uplink is reallocated in a wireless communication system, the method comprising:
   transmitting control information for the uplink resource reallocation to a corresponding terminal;
   according to the uplink resource reallocation, receiving an uplink packet from the corresponding terminal and determining whether the corresponding terminal receives the control information; and
   when the corresponding terminal does not receive the control information, informing the corresponding terminal of the determination result by transmitting a NULL signal over a feedback channel for previous uplink resource allocation.

2. The method of claim 1, wherein the feedback channel comprises a downlink ACKnowledgement (ACK) channel.

3. The method of claim 1, wherein the receiving of the uplink packet from the corresponding terminal and the determining of whether the corresponding terminal receives the control information are based on a signal-to-noise ratio measurement of a packet received through the reallocated uplink resource.

4. The method of claim 1, further comprising:
   applying Cyclic Redundancy Check (CRC) to the packet received through the reallocated uplink resource; and
   when the CRC is successful, transmitting an ACKnowledgement (ACK) signal to the corresponding terminal over a feedback channel for the uplink resource reallocation.

5. The method of claim 1, further comprising:
   applying Cyclic Redundancy Check (CRC) to the packet received through the reallocated uplink resource; and
   when failing the CRC and determining that the corresponding terminal receives the control information, transmitting a NACK signal to the corresponding terminal over a feedback channel for the uplink resource reallocation.

6. A method for operating a terminal for transmitting and receiving data when a resource for uplink is reallocated in a wireless communication system, the method comprising:
   receiving an uplink resource allocated and transmitting a packet to a base station;
   receiving at least one of an ACKnowledgement (ACK) signal, a Negative ACKnowledgement (NACK) signal, and a NULL signal over a feedback channel for the uplink resource allocation; and
   when receiving the NULL signal, receiving control information relating to uplink resource reallocation in a next uplink resource allocation period.

7. The method of claim 6, wherein, when the NULL signal is received, retransmission is aborted.

8. The method of claim 6, wherein, when the ACK signal is received, a next packet is transmitted according to the uplink resource reallocation.

9. The method of claim 6, wherein, when the NACK signal is received, the packet is retransmitted in the next uplink resource allocation period.

10. A method for operating a terminal for transmitting and receiving data when a resource for uplink is reallocated in a wireless communication system, the method comprising:
    determining whether a period is an uplink persistent resource allocation period;
    in the uplink persistent resource allocation period, receiving at least one of an ACKnowledgement (ACK) signal, a Negative ACKnowledgement (NACK) signal, and a NULL signal over a feedback channel for the uplink resource allocation; and
    when receiving the NULL signal, receiving control information relating to uplink resource reallocation in a next uplink resource allocation period.

11. The method of claim 10, wherein the receiving of the at least one of the ACK signal, the NACK signal, and the NULL signal is based on feedback information of a base station.

12. The method of claim 10, wherein, when the NULL signal is received, retransmission is aborted.

13. The method of claim 10, wherein, when the ACK signal is received, a next packet is transmitted according to the uplink resource reallocation.

14. The method of claim 10, wherein, when the NACK signal is received, the packet is retransmitted in the next uplink resource allocation period.

15. The method of claim 10, further comprising:
in a non-uplink persistent resource allocation period, receiving at least one of the ACK signal and the NACK signal over the feedback channel for the uplink resource allocation; and
when receiving the ACK signal, receiving control information relating to uplink resource reallocation in a next uplink resource allocation period.

16. The method of claim 15, wherein, when the NACK signal is received, the packet is retransmitted in the next uplink resource allocation period.

17. An apparatus of a base station for transmitting and receiving data when a resource for uplink is reallocated in a wireless communication system, the apparatus comprising:
a transmitter for transmitting control information for the uplink resource reallocation to a corresponding terminal; and
a controller for, according to the uplink resource reallocation, receiving an uplink packet from the corresponding terminal and for determining whether the corresponding terminal receives the control information, and when determining that the corresponding terminal does not receive the control information, for informing the corresponding terminal of the determination result by transmitting a NULL signal over a feedback channel for previous uplink resource allocation.

18. The apparatus of claim 17, wherein the feedback channel comprises a downlink ACKnowledgement (ACK) channel.

19. The apparatus of claim 17, wherein, to receive the uplink packet from the corresponding terminal and to determine whether the corresponding terminal receives the control information, the controller measures a signal-to-noise ratio of a packet received through the reallocated uplink resource.

20. The apparatus of claim 17, wherein the controller performs Cyclic Redundancy Check (CRC) on the packet received through the reallocated uplink resource, and
when the CRC is successful, the controller transmits an ACKnowledgement (ACK) signal to the corresponding terminal over the feedback channel for the uplink resource reallocation.

21. The apparatus of claim 17, wherein the controller performs a Cyclic Redundancy Check (CRC) on the packet received through the reallocated uplink resource, and
when failing the CRC and determining that the corresponding terminal receives the control information, the controller transmits a Negative ACKnowledgement (NACK) signal to the corresponding terminal over the feedback channel for the uplink resource reallocation.

22. An apparatus of a terminal for transmitting and receiving data when a resource for uplink is reallocated in a wireless communication system, the apparatus comprising:
a transmitter for receiving an uplink resource allocated and transmitting a packet to a base station; and
a controller for receiving at least one of an ACKnowledgement (ACK) signal, a Negative ACKnowledgement (NACK) signal, and a NULL signal over a feedback channel for the uplink resource allocation, and for, when receiving the NULL signal, receiving control information relating to uplink resource reallocation in a next uplink resource allocation period.

23. The apparatus of claim 22, wherein, when receiving the NULL signal, the controller aborts retransmission.

24. The apparatus of claim 22, wherein, when receiving the ACK signal, the controller transmits a next packet according to the uplink resource reallocation.

25. The apparatus of claim 22, wherein, when receiving the NACK signal, the controller retransmits the packet in the next uplink resource allocation period.

26. An apparatus of a terminal for transmitting and receiving data when a resource for uplink is reallocated in a wireless communication system, the apparatus comprising:
a controller for determining whether a period is an uplink persistent resource allocation period, in the uplink persistent resource allocation period, for receiving at least one of an ACKnowledgement ACK signal, a Negative ACKnowledgement (NACK) signal, and a NULL signal over a feedback channel for the uplink resource allocation, and for, when receiving the NULL signal, receiving control information relating to uplink resource reallocation in a next uplink resource allocation period.

27. The apparatus of claim 26, wherein the receiving of the at least one of the ACK signal, the NACK signal, and the NULL signal is based on feedback information of a base station.

28. The apparatus of claim 26, wherein, when receiving the NULL signal, the controller aborts retransmission.

29. The apparatus of claim 26, wherein, when receiving the ACK signal, the controller transmits a next packet according to the uplink resource reallocation.

30. The apparatus of claim 26, wherein, when receiving the NACK signal, the controller retransmits the packet in the next uplink resource allocation period.

31. The apparatus of claim 26, wherein, in a non-uplink persistent resource allocation period, the controller receives at least one of the ACK signal and the NACK signal over the feedback channel for the uplink resource allocation, and
when receiving the ACK signal, the controller receives control information relating to uplink resource reallocation in a next uplink resource allocation period.

32. The apparatus of claim 31, wherein, when receiving the NACK signal, the controller retransmits the packet in the next uplink resource allocation period.

* * * * *